(12) United States Patent
Izumi et al.

(10) Patent No.: US 7,128,788 B2
(45) Date of Patent: Oct. 31, 2006

(54) MANUFACTURING APPARATUS FOR BURIED INSULATING LAYER-TYPE SEMICONDUCTOR SILICON CARBIDE SUBSTRATE

(75) Inventors: Katsutoshi Izumi, Sakai (JP); Motoi Nakao, Osaka (JP); Yoshiaki Ohbayashi, Nara (JP); Keiji Mine, Yao (JP); Seisaku Hirai, Yao (JP); Fumihiko Jobe, Yao (JP); Tomoyuki Tanaka, Sakai (JP)

(73) Assignees: Osaka Prefecture, Osaka (JP); Hosiden Corporation, Yao (JP)

( * ) Notice: Subject to any disclaimer, the term of this patent is extended or adjusted under 35 U.S.C. 154(b) by 31 days.

(21) Appl. No.: 10/802,806

(22) Filed: Mar. 18, 2004

(65) Prior Publication Data
US 2004/0173154 A1 Sep. 9, 2004

Related U.S. Application Data

(62) Division of application No. 10/351,385, filed on Jan. 27, 2003.

(30) Foreign Application Priority Data
Jan. 31, 2002 (JP) ............................. 2002-022631

(51) Int. Cl.
C23C 16/00 (2006.01)
H01L 21/20 (2006.01)
H01L 21/36 (2006.01)
(52) U.S. Cl. ....................................... 118/715; 438/479
(58) Field of Classification Search ................ 438/479; 117/94, 99, 102, 105; 118/715
See application file for complete search history.

(56) References Cited

U.S. PATENT DOCUMENTS

| | | | |
|---|---|---|---|
| 4,664,944 A * | 5/1987 | Hsu et al. ................. | 117/102 |
| 5,415,126 A | 5/1995 | Loboda et al. ............. | 117/88 |
| 5,759,908 A * | 6/1998 | Steckl et al. ............... | 438/479 |
| 5,880,491 A | 3/1999 | Soref et al. ................ | 257/190 |

FOREIGN PATENT DOCUMENTS

| | | |
|---|---|---|
| EP | 0454456 | 10/1991 |
| EP | 1265274 | 12/2002 |
| JP | 06191997 | 7/1994 |

OTHER PUBLICATIONS

Andrew J. Steckl and J.P. Li, "Epitaxial Growth of beta-SiC on Si by RTCVD with C3H8 and SiH4", IEEE Transactions on Electron Devices, vol. 39, No. 1, Jan. 1992, pp. 64-74.*
European Search Report dated Dec. 16, 2005.

* cited by examiner

Primary Examiner—Carl Whitehead, Jr.
Assistant Examiner—Heather Doty
(74) Attorney, Agent, or Firm—Armstrong, Kratz, Quintos, Hanson & Brooks, LLP.

(57) ABSTRACT

A manufacturing method for a buried insulating layer-type semiconductor silicon carbide substrate comprises the step of placing an SOI substrate 100, which has a surface silicon layer 130 of a predetermined thickness and a buried insulator 120, in a heating furnace 200 and of increasing the temperature of the atmosphere within heating furnace 200 while supplying a mixed gas (G1+G2) of a hydrogen gas G1 and of a hydrocarbon gas G2 into heating furnace 200, thereby, of metamorphosing surface silicon layer 130 of SOI substrate 100 into a single crystal silicon carbide thin film 140.

5 Claims, 2 Drawing Sheets

MANUFACTURING APPARATUS FOR BURIED INSULATING LAYER-TYPE SEMICONDUCTOR SILICON CARBIDE SUBSTRATE

CROSS REFERENCE TO RELATED APPLICATION

This application is a division of Ser. No. 10/351,385 filed Jan. 27, 2003, which is based on Japanese Application No. 2002-022,631 filed Jan. 31, 2002.

BACKGROUND OF THE INVENTION

1. Field of the Invention

The present invention relates to a manufacturing method for a buried insulating layer-type semiconductor silicon carbide substrate and to a manufacturing apparatus thereof.

2. Prior Art

Single crystal silicon carbide (SiC) has been focused on as a material for semiconductor devices of the next generation because of its characteristics wherein single crystal silicon carbide is excellent in thermal and chemical stability, has a high mechanical strength and is stable when exposed to radiation. In addition, an SOI substrate having a buried insulating layer is excellent in achieving an increase in the speed of a circuit and a reduction in power consumption and, therefore, is expected to be used as an LSI substrate of the next generation. Accordingly, a buried insulating layer-type semiconductor silicon carbide substrate having these two characteristics is, therefore, expected to be used as a material for semiconductor devices.

At present, however, a manufacturing method for a buried insulating layer-type semiconductor silicon carbide substrate having the characteristics of single crystal silicon carbide and an SOI substrate has not yet been established.

As for a method for forming a single crystal silicon carbide thin film on a silicon substrate, a plasma-type vapor phase reaction, or the like, for example, maybe carried out on a silicon substrate and it is possible to apply such a technique to an SOI substrate so that a single crystal silicon carbide thin film is formed on the SOI substrate. In addition, at present, the film thickness of the surface silicon layer in an SOI substrate exceeds 50 nm.

There is a problem with a semiconductor substrate that has been manufactured according to a method for forming a single crystal silicon carbide thin film on an SOI substrate wherein a silicon layer is intervened between the single crystal silicon carbide thin film and the buried insulator. A problem arises wherein such a silicon layer intervened between a single crystal silicon carbide thin film and a buried insulator diffuses into the single crystal silicon carbide thin film on the surface of the substrate during a heat treatment in a later process leading to the deterioration of the physical characteristics thereof. In addition, the desired structure wherein silicon carbide is formed on the buried insulator is not gained.

In addition, a film formation process must be carried out in a high vacuum according to a method for forming a single crystal silicon carbide thin film on an SOI substrate by means of a plasma-type vapor phase reaction, or the like, and, therefore, a manufacturing apparatus having a complex structure is required. A problem wherein the cost for the formation of a single crystal silicon carbide thin film is increased is of course involved with such a manufacturing apparatus due to its complex structure.

In addition, in the case of an SOI substrate having a surface silicon layer of which the film thickness exceeds 10 nm, the metamorphoseed single crystal silicon carbide thin film locally causes nucleus growth leading to the formation of grains and, thereby, the surface of the substrate becomes coarse, bringing about an unfavorable condition.

SUMMARY OF THE INVENTION

The present invention is provided in view of the above described situation and a purpose thereof is to provide a manufacturing method for, and a manufacturing apparatus of, a buried insulating layer-type semiconductor silicon carbide substrate which allows the formation of a single crystal silicon carbide thin film on an SOI substrate at a low cost and in a feasible manner.

A manufacturing method for a buried insulating layer-type semiconductor silicon carbide substrate according to the present invention is provided with: the first step of placing an SOI substrate having a surface silicon layer of which the film thickness is no greater than 10 nm and having a buried insulator in a heating furnace and of increasing the temperature of the atmosphere within the heating furnace while supplying a mixed gas of a hydrogen gas and a hydrocarbon gas into the above described heating furnace so that the surface silicon layer of the above described SOI substrate is metamorphoseed into a single crystal silicon carbide thin film; the second step of depositing a carbon thin film on the above described single crystal silicon carbide thin film by excessively carrying out the above described first step; the third step of replacing the above described mixed gas with an inert gas wherein an oxygen gas is mixed in a predetermined ratio and of heating the above described SOI substrate up to 550° C., or higher, so that the above described carbon thin film is removed through etching; the fourth step of replacing the above described inert gas, wherein an oxygen gas is mixed, with a pure inert gas, wherein no oxygen gas is mixed, and of increasing the temperature of the atmosphere within the above described heating furnace up to a predetermined temperature; and the fifth step of supplying a hydrogen gas and a silane-based gas into the heating furnace under the condition wherein the above described predetermined temperature of the atmosphere is maintained so that a new single crystal silicon carbide thin film is made to glow on the single crystal silicon carbide thin film on the surface of the above described SOI substrate.

In addition, a manufacturing apparatus of a buried insulating layer-type semiconductor silicon carbide substrate according to the present invention is provided with a heating furnace wherein an SOI substrate having a surface silicon layer of which the film thickness is no greater than 10 nm and having a buried insulator is placed and which has a heating means for heating the SOI substrate and with a gas supply means for supplying a variety of gases into this heating furnace and the above described gas supply means can supply, at least, a hydrogen gas, a hydrocarbon gas, an oxygen gas, an inert gas and a silane-based gas into the heating furnace.

DESCRIPTION OF THE PREFERRED EMBODIMENTS

Figure 1:
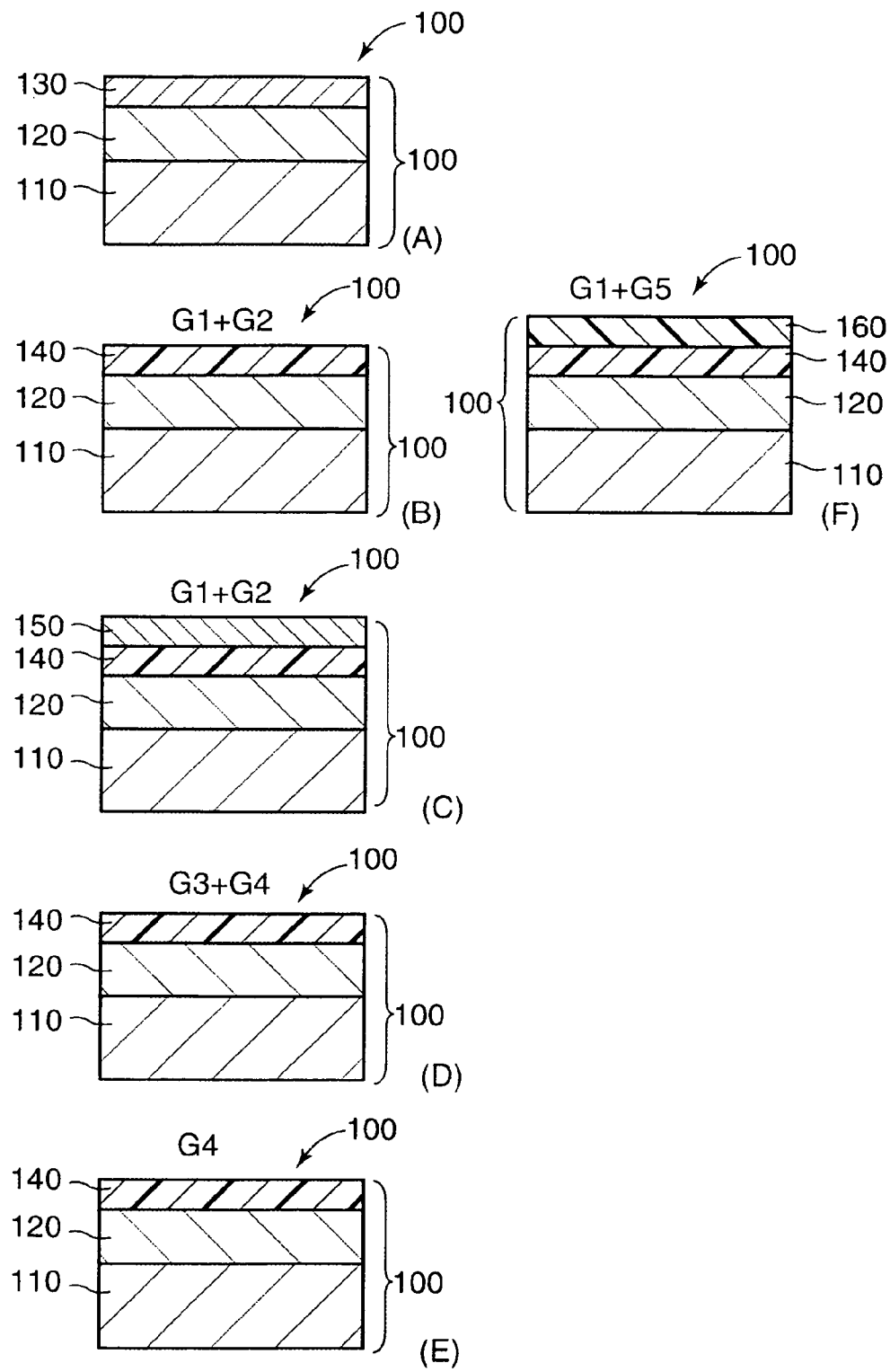
FIGS. 1A to 1F are schematic views showing the respective steps of the manufacturing method for a buried insulating layer-type semiconductor silicon carbide substrate according to an embodiment of the present invention.
Figure 2:
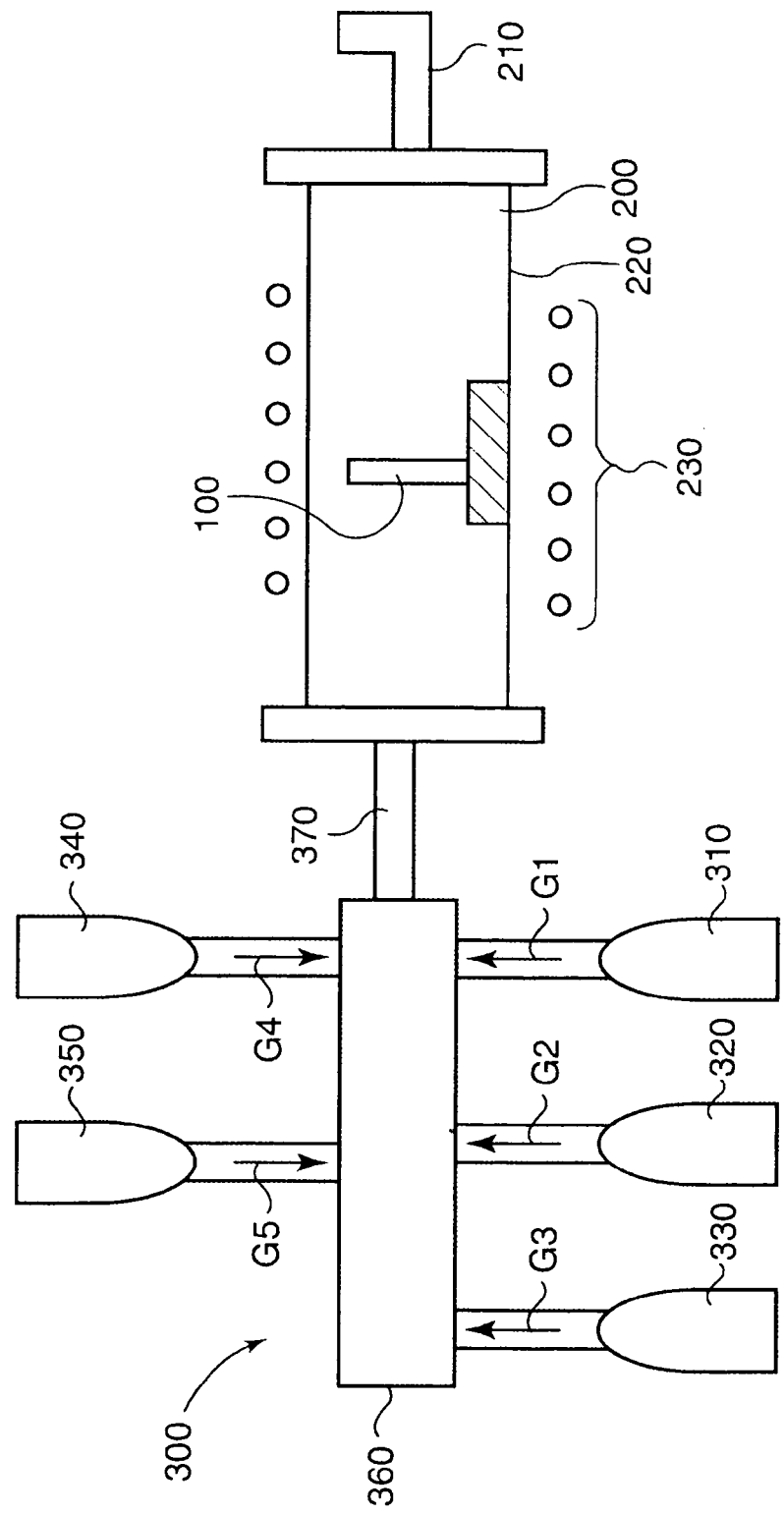
FIG. 2 is a schematic view of a manufacturing apparatus for manufacturing a buried insulating layer semiconductor silicon carbide substrate for carrying out a manufacturing method for a buried insulating layer semiconductor silicon carbide substrate according to an embodiment of the present invention.

FIGS. 1A, 1B, 1C, 1D, 1E and 1F are schematic views showing the respective steps of a manufacturing method for a buried insulating layer-type semiconductor silicon carbide substrate according to an embodiment of the present invention; and FIG. 2 is a schematic view of a manufacturing apparatus for manufacturing a buried insulating layer-type semiconductor silicon carbide substrate according to a manufacturing method for a buried insulating layer-type semiconductor silicon carbide substrate according to an embodiment of the present invention. Here, the dimensions of the thicknesses of the respective layers in FIG. 1 differ from the actual proportions for the purpose of convenience of illustration. In addition, FIG. 1 specifies the surrounding gas in each step of the manufacturing method for a buried insulating layer-type semiconductor silicon carbide substrate.

The manufacturing method for a buried insulating layer-type semiconductor silicon carbide substrate according to an embodiment of the present invention has: the first step of placing an SOI substrate 100 having a surface silicon layer 130 of which the film thickness is no greater than 10 nm and having a buried insulator layer 120 in a heating furnace 200 and increasing the temperature of the atmosphere within heating furnace 200 while supplying a mixed gas (G1+G2) of a hydrogen gas G1 and a hydrocarbon gas G2 into the above described heating furnace 200 and, thereby, of metamorphoseing surface silicon layer 130 of the above described SOI substrate 100 into a single crystal silicon carbide thin film 140; the second step of depositing a carbon thin film 150 on the above described single crystal silicon carbide thin film 140 by excessively carrying out the above described first step; the third step of replacing the above described mixed gas (G1+G2) with an inert gas G4 wherein an oxygen gas G3 is mixed in a predetermined ratio and, after that, of heating the above described SOI substrate 100 up to 550° C., or higher, so as to remove the above described carbon thin film 150 through etching; the fourth step of then replacing inert gas G4, wherein the above described oxygen gas G3 is mixed, with a pure inert gas G4, wherein no oxygen gas G3 is mixed, and of increasing the temperature of the atmosphere within the above described heating furnace 200 up to a predetermined temperature; and the fifth step of supplying hydrogen gas G1 and a silane-based gas G5 into heating furnace 200 under the condition wherein the above described predetermined temperature of the atmosphere is maintained so that a new single crystal silicon carbide thin film 160 is made to grow on single crystal silicon carbide thin film 140 on the surface of the above described SOI substrate 100.

The above described SOI substrate 100 is gained, as shown in FIG. 1A, by forming a buried insulator layer 120 in a silicon layer 110 as a buried insulator and by forming a surface silicon layer 130 having a film thickness of no greater than 10 nm on this buried insulator layer 120. Here, the crystal orientation in surface silicon layer 130 of this SOI substrate 100 is, for example, in the plane direction (111).

Here, the film thickness of surface silicon layer 130 of SOI substrate 100 is controlled according to a well-known method such that surface silicon layer 130 is oxidized and is etched by hydrofluoric acid, or the like, so that a desired thickness of the surface silicon layer remains In addition, an electrical furnace can be used as the above described heating furnace 200. As shown in FIG. 2, one end of this heating furnace 200 has an opening through which an SOI substrate, or the like, is inserted into, or extracted from, the furnace while the other end is connected to an exhaust means 210 and a heating means 230 such as an electrical heater is installed around the furnace wall 220. In addition, a gas supply means 300 for supplying a variety of gases into the furnace is connected to this heating furnace 200. Then, the pressure inside of this heating furnace 200 is equal to atmospheric pressure.

The above described gas supply means 300 has a hydrogen gas supply part 310 for supplying a hydrogen gas G1, a hydrocarbon gas supply part 320 for supplying a hydrocarbon gas G2, an oxygen gas supply part 330 for supplying an oxygen gas G3, an inert gas supply part 340 for supplying an argon gas as an inert gas G4 (including a pure inert gas), a silane-based gas supply part 350 for supplying a silane-based gas G5 and a switching valve 360 to which these gas supply parts 310 to 350 are connected. This gas supply means 300 is connected to the above described heating furnace 200 via a supply tube 370.

<First Step>(see FIG. 1B)

The above described SOI substrate 100 is placed inside of heating furnace 200 and a mixed gas (G1+G2), wherein hydrocarbon gas G2 is mixed with hydrogen gas G1 so that the ratio of the hydrocarbon gas becomes 1 volume a, is supplied into heating furnace 200 in this first step. In addition, simultaneously as this supply of mixed gas (G1+G2), the temperature of the atmosphere within heating furnace 200 is heated up to 1200° C. to 1405° C. As a result of this application of heat, surface silicon layer 130 of SOI substrate 100 is metamorphoseed to single crystal silicon carbide thin film 140. That is to say, surface silicon layer 130 of SOI substrate 100 is metamorphoseed to single crystal silicon carbide thin film 140 in this first step.

The above described single crystal silicon carbide thin film 140 is gained by metamorphoseing surface silicon layer 130 and, therefore, the film thickness of single crystal silicon carbide thin film 140 becomes equal to the film thickness of surface silicon layer 130. That is to say, the film thickness of single crystal silicon carbide thin film 140 can be arbitrarily controlled according to the film thickness of surface silicon layer 130 of SOI substrate 100.

Here, the above described hydrogen gas G1 is a carrier gas and a propane gas is utilized as hydrocarbon gas G2. In the case that the amount of supply of hydrogen gas G1 from hydrogen gas supply part 310 is 1000 cc/min, for example, the amount of supply of hydrocarbon gas G2 from hydrocarbon gas supply part 320 is adjusted to be 10 cc/min.

<Second Step> (see FIG. 1C)

The above described first step is excessively carried out so that carbon thin film 150 is deposited on the above described single crystal silicon carbide thin film 140 in this second step. The above described carbon thin film 150 is deposited by continuing the above described first step for a period of time of, for example, from several minutes to several hours.

<Third Step> (see FIG. 1D)

In this third step, mixed gas (G1+G2) of hydrocarbon gas G2 supplied from the above described hydrocarbon gas supply part 320 and of hydrogen gas G1 supplied from hydrogen gas supply part 310 is replaced with inert gas G4, wherein oxygen G3 is mixed in a predetermined ratio and, then, the above described SOI substrate 100 is heated up to no less than 550° C., for example, approximately 650° C. so that the above described carbon thin film 150 is etched and removed. An argon gas, for example, is used as the above described inert gas G4. In addition, as for oxygen gas G3 mixed with this inert gas G4, in the case that the amount of supply of inert gas G4 from inert gas supply part 340 is 1000 cc/min, for example, the amount of supply of oxygen gas G3 from oxygen gas supply part 330 is adjusted to 100 cc/min.

At the same time when inert gas G4 mixed with this oxygen gas G3 is supplied, SIO substrate 100 is heated up to approximately 650° C. by means of heating means 230. This condition is maintained for a period of time of from several minutes to several hours.

Carbon thin film 150 formed on the surface of SOI substrate 100 is changed to a carbon dioxide gas as a result of a chemical reaction of $C+O_2 \rightarrow CO_2$. Thereby, carbon thin film 150 is etched and removed. Here, this carbon dioxide gas is released to the outside of heating furnace 200 by means of exhaust means 210.

<Fourth Step> (see FIG. 1E)

In this fourth step, the above described inert gas G4, wherein an oxygen gas is mixed, is replaced with a pure inert gas G4 wherein no oxygen gas is mixed and the temperature of the atmosphere within the above described heating furnace 200 is increased up to a predetermined temperature. Here, a pure argon gas is utilized as the above described pure inert gas G4. A purpose of the replacement of the gas within heating furnace 200 with pure inert gas G4 in this fourth step is to avoid the risk of an explosive reaction of a methyl silane gas with an oxygen gas when silane-based gas G5 is utilized in the, subsequent, fifth step.

As for the above described temperature of the atmosphere within heating furnace 200, 500° C. to 1405° C. is appropriate.

Here, the above described pure inert gas G4 is supplied to heating furnace 200 by stopping the supply of oxygen gas G3 that has been supplied to heating furnace 200 in the above described third step and by continuing the supply of inert gas G4.

<Fifth Step> (see FIG. 1F)

In this fifth step, hydrogen gas G1 is supplied from hydrogen gas supply part 310 into heating furnace 200 and silane-based gas G5 is supplied from silane-based gas supply part 350 into heating furnace 200, respectively, under the condition wherein the above described predetermined temperature (500° C. to 1405° C.) of the atmosphere is maintained so that new single crystal silicon carbide thin film 160 is made to grow on single crystal silicon carbide thin film 140 on the surface of the above described SOI substrate 100.

As the above described silane-based gas G5, for example, a methyl silane gas is used. Silicon is generated as a result of decomposition of this methyl silane gas and is reacted with carbon in single crystal silicon carbide thin film 140 and, thereby, an additional single crystal silicon carbide thin film 160 is formed on single crystal silicon carbide thin film 140.

Here, as the above described silane-based gas G5, a monosilane gas, a disilane gas, a dimethylsilane gas, a dichlorosilane gas, or the like, in addition to the methyl silane gas can be utilized.

A buried insulating layer-type semiconductor silicon carbide substrate having single crystal silicon carbide thin films 140 and 160 can be manufactured in the above described manner.

Here, though hydrogen gas G1 is supplied from hydrogen gas supply part 310, hydrocarbon gas G2 is supplied from hydrocarbon gas supply part 320, oxygen gas G3 is supplied from oxygen gas supply part 330, inert gas G4 (including a pure inert gas) is supplied from inert gas supply part 340 and silane-based gas G5 is supplied from silane-based gas supply part 350, respectively, in the above described embodiment, mixed gas (G1+G2) required for the first step may be prepared in advance by mixing hydrogen gas G1 and hydrocarbon gas G2 in a predetermined ratio, the mixed gas required for the third step may be prepared in advance by mixing inert gas G4 and oxygen gas G3 in a predetermined ratio and the hydrogen gas and silane-based gas required for the fifth step may be mixed in advance in a predetermined ratio.

Here, it can be said that the type of system wherein a variety of gases are separately supplied is more flexible, from a point of view of the feasibility of altering the mixture ratio of the various gases in order to cope with a variety of chemical reactions, than the type of system wherein a mixed gas prepared in advance by mixing a variety of gases in a predetermined ratio is supplied.

The manufacturing method for a buried insulating layer-type semiconductor silicon carbide substrate according to the present invention has the step of placing an SOI substrate, having a surface silicon layer of which the film thickness is no greater than 10 nm and having a buried insulator, in a heating furnace and of increasing the temperature of the atmosphere within the heating furnace while supplying a mixed gas of a hydrogen gas and of a hydrocarbon gas into the above described heating furnace so that the surface silicon layer of the above described SOI substrate is metamorphoseed into a single crystal silicon carbide thin film.

Therefore, a single crystal silicon carbide thin film can be formed directly above a buried oxide layer according to this manufacturing method without an intervention of a silicon layer, which has caused a problem in a conventional plasma-type vapor phase reaction method, or the like, between the single crystal silicon carbide thin film and the buried oxide layer. Therefore, a buried insulating layer-type semiconductor silicon carbide substrate manufactured according to this manufacturing method solves the conventional problems such as occurrence of a variety of defects, and a coarse interface, in the interface between the single crystal silicon carbide thin film and the silicon layer located beneath the single crystal silicon carbide thin film. In addition, this manufacturing method solely requires a simple heating furnace, such as an electrical furnace, and it is not necessary to maintain a high vacuum as in a prior art and, therefore, this manufacturing method can contribute to the simplification of the manufacturing apparatus and of the manufacturing process and, as a result, can contribute to reduction in manufacturing costs.

In addition, when the film thickness of the surface silicon layer is no greater than 10 nm, unlike the case of a film thickness of no less than 10 nm, a coarse surface due to the occurrence of grains caused by local nucleus growth in single crystal silicon carbide is eliminated, so that an excellent surface condition can be gained.

What is claimed is:

1. A manufacturing apparatus of a buried insulating layer-type semiconductor silicon carbide substrate, comprising: a heating furnace in which an SOI substrate having a surface silicon layer of a predetermined thickness and having a buried insulator is placed and which has a heating means for heating the SOI substrate; and a gas supply means for supplying a variety of gases into this heating furnace; and
- an exhaust means for exhausting gases within the heating furnace to outside,
- wherein the manufacturing apparatus is configured to control the heating means and the gas supply means
- in order to increase an ambient temperature within said heating furnace up to between 1,200 and 1,405° C. while supplying a mixed gas of a hydrogen gas and of a hydrocarbon gas into said heating furnace so as to metamorphose said surface silicon layer of the SOI substrate into a single crystal silicon carbide thin film,
- in order to maintain the metamorphosing state for a period of time of between several minutes and several hours so as to deposit a carbon film on said single crystal silicon carbide thin film,
- in order to replace said mixed gas with an inert gas wherein an oxygen gas is mixed in a predetermined ratio and heat said SOI substrate up to 550° C. or higher so as to remove said carbon thin film through etching.

2. The manufacturing apparatus of a buried insulating layer-type semiconductor silicon carbide substrate, comprising:
- a heating furnace in which an SOI substrate having a surface silicon layer of a predetermined thickness on an insulator layer buried in the substrate, the heating furnace including a heating means for heating the SOI substrate; and
- a gas supply means for supplying a variety of gases into this heating furnace,
- wherein the manufacturing apparatus is configured to control the heating means and the gas supply means
- in order to increase an ambient temperature within said heating furnace up to between 1,200 and 1,405° C. while supplying a mixed gas of a hydrogen gas and of a hydrocarbon gas into said heating furnace so as to metamorphose said surface silicon layer of the SOI substrate into a single crystal silicon carbide thin film,
- in order to maintain the metamorphosing state for a period of time of between several minutes and several hours so as to deposit a carbon film on said single crystal silicon carbide thin film,
- in order to replace said mixed gas with an inert gas wherein an oxygen gas is mixed in a predetermined ratio and heat said SOI substrate up to 550° C. or higher so as to remove said carbon thin film through etching,
- in order to replace said inert gas with a pure inert gas into which no oxygen gas is mixed, increase the ambient temperature within said heating furnace up to between 500 and 1,405° C. and supply a hydrogen gas and a silane-based gas into the heating furnace under a condition wherein said ambient temperature is maintained so as to grow a new single crystal silicon carbide thin film on said single crystal silicon carbide thin film.

3. The manufacturing apparatus of a buried insulating layer-type semiconductor silicon carbide substrate according to claim 2, wherein the apparatus is provided with an exhaust means for exhausting gases within said heating furnace to the outside.

4. A manufacturing apparatus of a buried insulating layer-type semiconductor silicon carbide substrate according to claim 3, wherein a series of reactions within said heating furnace are conducted at atmospheric pressure.

5. A manufacturing apparatus of a buried insulating layer-type semiconductor silicon carbide substrate according to claim 2, wherein a series of reactions within said heating furnace are conducted at atmospheric pressure.

* * * * *